(12) United States Patent
Watanabe (10) Patent No.: US 8,772,070 B2
(45) Date of Patent: Jul. 8, 2014

(54) METHOD FOR MANUFACTURING SOLID-STATE IMAGING DEVICE

(75) Inventors: Manjirou Watanabe, Saitama (JP); Miyuki Watanabe, legal representative, Isehara (JP)

(73) Assignee: FUJIFILM Corporation, Tokyo (JP)

(*) Notice: Subject to any disclaimer, the term of this patent is extended or adjusted under 35 U.S.C. 154(b) by 263 days.

(21) Appl. No.: 13/063,240

(22) PCT Filed: Sep. 2, 2009

(86) PCT No.: PCT/JP2009/065302
§ 371 (c)(1),
(2), (4) Date: Apr. 22, 2011

(87) PCT Pub. No.: WO2010/029876
PCT Pub. Date: Mar. 18, 2010

(65) Prior Publication Data
US 2011/0189808 A1 Aug. 4, 2011

(30) Foreign Application Priority Data
Sep. 11, 2008 (JP) ................................. 2008-233519

(51) Int. Cl.
*H01L 21/00* (2006.01)
(52) U.S. Cl.
USPC ............ 438/66; 438/65; 438/98; 257/E31.11; 257/E31.117
(58) Field of Classification Search
USPC ........................ 438/66; 257/E31.11
See application file for complete search history.

(56) References Cited

U.S. PATENT DOCUMENTS

| 6,396,043 B1* | 5/2002 | Glenn et al. ............... 250/208.1 |
| 2005/0072931 A1 | 4/2005 | Albagli et al. |
| 2006/0273435 A1* | 12/2006 | Lin et al. ....................... 257/678 |
| 2008/0003926 A1 | 1/2008 | Watanabe et al. |

FOREIGN PATENT DOCUMENTS

| JP | 2002-231919 A | 8/2002 |
| JP | 2004-296738 A | 10/2004 |
| JP | 2004296738 A * | 10/2004 |
| JP | 2005-114731 A | 4/2005 |

(Continued)

OTHER PUBLICATIONS

International Preliminary Report on Patentability and Written Opinion, mailed Mar. 24, 2011, issued in corresponding International Application No. PCT/JP2009/065302, 11 pages in English and Japanese.

*Primary Examiner* — Charles Garber
*Assistant Examiner* — Abdulfattah Mustapha
(74) *Attorney, Agent, or Firm* — Sughrue Mion, PLLC (57) ABSTRACT

A method for manufacturing solid-state imaging device for collectively manufacturing a multiplicity of solid-state imaging devices at a wafer level, the method including: a step of reducing the thickness of a cover glass wafer (10) after providing a mask material (12) to the cover glass wafer (10) including frame-shaped spacers (5); a step of releasing the mask material (12) and laminating a first support wafer (14) through a lamination member (16); a step of positioning and bonding a silicon wafer (18) and the cover glass wafer (10), the silicon wafer (18) including a second support wafer (22) laminated on the back side through a lamination member (24); a step of dicing the cover glass wafer (10) into cover glasses (4) by a whetstone (26); and a step of dicing the silicon wafer (18) by a whetstone (28).

11 Claims, 7 Drawing Sheets

(56) References Cited

FOREIGN PATENT DOCUMENTS

| | | |
|---|---|---|
| JP | 2006-100587 A | 4/2006 |
| JP | 2006-100762 A | 4/2006 |
| JP | 2006-147864 A | 6/2006 |
| JP | 2006-253597 A | 9/2006 |
| JP | 2007-188909 A | 7/2007 |
| JP | 2007-258750 A | 10/2007 |
| JP | 2008-041696 A | 2/2008 |
| JP | 2008-166585 A | 7/2008 |
| WO | 2006/035963 A1 | 4/2006 |
| WO | 2007/069750 A1 | 6/2007 |
| WO | 2008/081847 A1 | 7/2008 |

* cited by examiner

METHOD FOR MANUFACTURING SOLID-STATE IMAGING DEVICE

CROSS REFERENCE TO RELATED APPLICATIONS

This application is a National Stage of International Application No. PCT/JP2009/065302 filed Sep. 2, 2009, which claims priority from Japanese Patent Application No. 2008-233519filed Sep. 11, 2008, the contents of all of which are incorporated herein by reference in their entirety.

TECHNICAL FIELD

The present invention relates to a method for manufacturing solid-state imaging device, and particularly, to a method for manufacturing thin solid-state imaging device.

BACKGROUND ART

The miniaturization of solid-state imaging devices constituted by CCD or CMOS used in digital cameras and cell phones is increasingly demanded. Therefore, there is a shift recently from a conventional large package including the entire solid-state imaging element chips hermetically sealed in a package of ceramics or the like to a chip size package (CSP) type that has substantially the same size as the size of the solid-state imaging element chip.

A method for collectively manufacturing the CSP-type solid-state imaging devices in a wafer level is disclosed, for example, in PTL 1. In the method described in PTL 1, a plurality of solid-state imaging elements that constitute light receiving sections are formed on a silicon wafer, a cover glass wafer made of a transparent material is bonded to the silicon wafer through spacers formed to correspond with the light receiving sections, and the cover glass wafer and the silicon wafer are cut and diced to collectively manufacture the solid-state imaging devices.

CITATION LIST

Patent Literature

PTL 1: Japanese Patent Application Laid-Open No. 2002-231919

SUMMARY OF INVENTION

Technical Problem

Along with the reduction in size and thickness of devices, such as digital cameras and cell phones, of recent years, further reduction in thickness of the solid-state imaging devices is increasingly demanded. There is the following problem in manufacturing thin solid-state imaging devices by the process described above.

To attain the reduction in thickness of the solid-state imaging devices, the thicknesses of the cover glass wafer, the spacer, and the silicon wafer need to be reduced. Therefore, if the thicknesses of the cover glass wafer and the silicon wafer are reduced, the rigidity is reduced, the deflection occurs, or the devices may be easily damaged even by an extremely small impact.

For example, assuming that the outer diameters of the cover glass wafer and the silicon wafer are 8 inches, if the thicknesses become 0.2 mm or less, a large deflection of several mm is generated just by the weights of the wafers. Particularly, although a multiplicity of frame-shaped spacers in the same height need to be formed in the surface of the cover glass wafer, the establishment of a process for forming the spacers is difficult if the shape of the cover glass wafer that serves as a base is unstable.

The present invention has been made in view of the circumstances, and an object of the present invention is to provide a method for manufacturing solid-state imaging device capable of easily manufacturing thin solid-state imaging devices in a wafer level.

Solution to Problem

To attain the object, a first method for manufacturing solid-state imaging device of the present invention is characterized by including: a step of forming a plurality of frame-shaped spacers and a ring-shaped spacer surrounding the frame-shaped spacers along an outer periphery of a transparent substrate, on one surface of the transparent substrate that serves as a base material of a cover glass; a step of providing a mask material on a side of the one surface of the transparent substrate to cover the frame-shaped spacers and the ring-shaped spacer; a step of removing the transparent substrate from a side of the other surface to set thickness within a predetermined range; a step of removing the mask material from the transparent substrate; a step of laminating a first support wafer on the other surface of the transparent substrate; a step of forming a plurality of solid-state imaging elements on one surface of a semiconductor substrate; a step of removing the semiconductor substrate from the side of the other surface to set thickness within a predetermined range; a step of laminating a second support wafer on the other surface of the semiconductor substrate; a step of bonding the semiconductor substrate and the transparent substrate through the spacers; a step of releasing the first support wafer and the second support wafer from the transparent substrate and the semiconductor substrate; a step of dicing the transparent substrate; and a step of dicing the semiconductor substrate.

To attain the object, a second method for manufacturing solid-state imaging device of the present invention is characterized by including: a step of forming a plurality of frame-shaped spacers and a ring-shaped spacer surrounding the frame-shaped spacers along an outer periphery of a transparent substrate, on one surface of the transparent substrate that serves as a base material of a cover glass; a step of providing a mask material on a side of the one surface of the transparent substrate to cover the frame-shaped spacers and the ring-shaped spacer; a step of removing the transparent substrate from a side of the other surface to set thickness within a predetermined range; a step of removing the mask material from the transparent substrate; a step of laminating a first support wafer on the other surface of the transparent substrate; a step of dicing the transparent substrate into cover glasses; a step of forming a plurality of solid-state imaging elements on one surface of a semiconductor substrate; a step of removing the semiconductor substrate from the side of the other surface to set thickness within a predetermined range; a step of laminating a second support wafer on the other surface of the semiconductor substrate; a step of bonding the semiconductor substrate and the cover glasses through the spacers; a step of releasing the first support wafer and the second support wafer from the transparent substrate and the semiconductor substrate; and a step of dicing the semiconductor substrate.

According to the methods for manufacturing solid-state imaging device of the present invention, since the spacers are formed on the transparent substrate with enough rigidity, there is no need to laminate a support wafer to form the spacers. Since the mask material is provided after the formation of the spacers to reduce the thickness of the transparent substrate, the surface on the side of the spacers of the transparent substrate can be protected by the mask material. The mask material can also prevent damage of the transparent substrate during handling after the reduction in thickness. Furthermore, the ring-shaped spacer formed along the outer periphery of the transparent substrate prevent the penetration of a chemical or the like when the thickness of the transparent substrate is reduced, and the ring-shaped spacer also function as stiffeners during handling.

Since the support wafers are attached to the transparent substrate with reduced thickness and the semiconductor substrate with reduced thickness, the rigidity and the flatness can be secured. As a result, the transparent substrate and the semiconductor substrate can be easily handled and bonded.

In the method for manufacturing solid-state imaging device of the present invention, it is preferable in the invention that the step of removing the transparent substrate from the side of the other surface to set the thickness within a predetermined range is a step of etching it from the side of the other surface by a chemical including hydrofluoric acid as a principal component.

In the method for manufacturing solid-state imaging device of the present invention, it is preferable in the invention that the mask material is resistant to hydrofluoric acid.

In the method for manufacturing solid-state imaging device of the present invention, it is preferable in the invention that the step of removing the transparent substrate from the side of the other side to set the thickness within a predetermined range is a step of polishing the transparent substrate from the side of the other surface by lapping and/or polishing.

In the method for manufacturing solid-state imaging device of the present invention, it is preferable in the invention that the mask material is a one-sided tape or an application solution in which the adhesive strength is reduced when external energy is provided.

In the method for manufacturing solid-state imaging device of the present invention, it is preferable in the invention that a member for laminating the transparent substrate and the first support wafer is a two-sided tape or an adhesive with a self-release property. In the method for manufacturing solid-state imaging device of the present invention, it is preferable in the invention that a member for laminating the semiconductor substrate and the second support wafer is a two-sided tape or an adhesive with a self-release property.

Since the lamination members have self-release functions, releasing can be easily performed without imposing a burden on the transparent substrate or the semiconductor substrate.

Advantageous Effects of Invention

According to the method for manufacturing solid-state imaging device of the present invention, thin solid-state imaging devices can be easily manufactured in a wafer level.

DESCRIPTION OF EMBODIMENTS

Preferred embodiments of the present invention will now be described in accordance with the attached drawings.

Although the present invention will be described by the following preferred embodiments, changes can be made by a multiplicity of methods without departing from the scope of the present invention, and embodiments other than the present embodiments can be used. Therefore, all changes within the scope of the present invention are included in CLAIMS.

A numerical range expressed by using "to" in the present specification denotes a range including numeric values described before and after "to".

Figure 1:
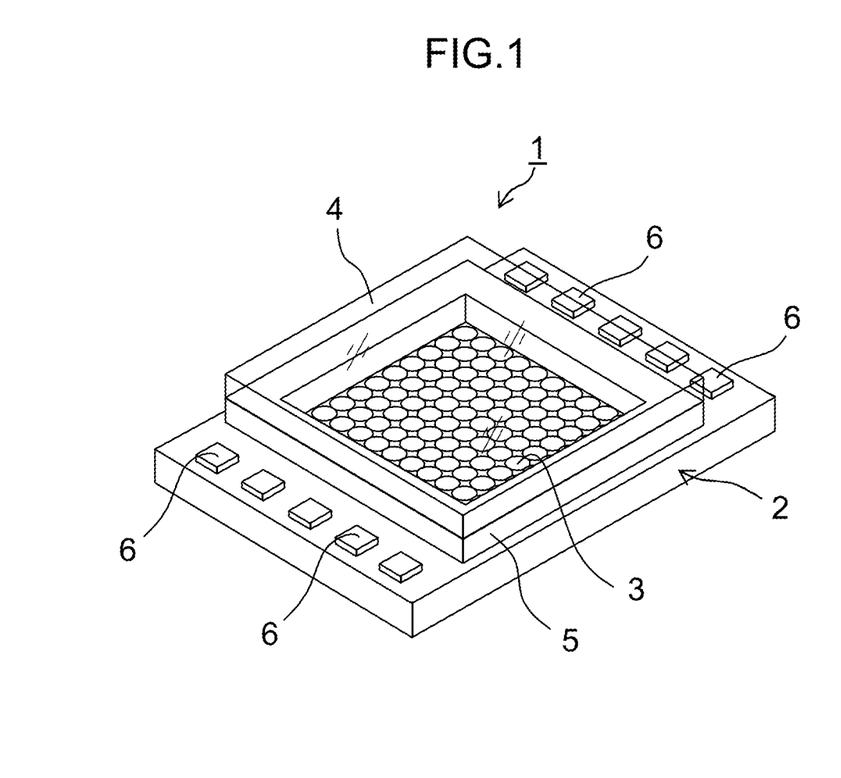
FIG. 1 is a perspective view of a solid-state imaging device manufactured by a method according to the present embodiments.
Figure 2:
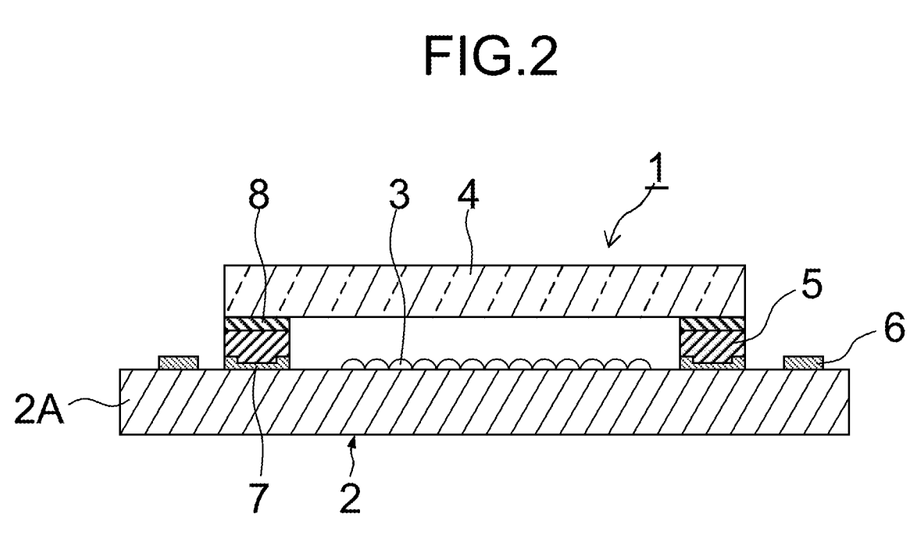
FIG. 2 is a cross-sectional view of the solid-state imaging device manufactured by the method according to the present embodiments.

FIGS. 1 and 2 are a perspective view and a cross-sectional view illustrating exterior shapes of a solid-state imaging device manufactured by a method according to the present invention.

A solid-state imaging device 1 includes a solid-state imaging element chip 2 including a plurality of solid-state imaging elements 3, a frame-shaped spacer 5 that is attached to the solid-state imaging element chip 2 and that surrounds the plurality of solid-state imaging elements 3, and a cover glass 4 that is attached over the frame-shaped spacer 5 and that seals the plurality of solid-state imaging elements 3.

The solid-state imaging element chip 2 is formed by dividing a semiconductor substrate from which solid-state imaging elements described below are manufactured, and the cover glass 4 is formed by dividing a transparent substrate also described below.

As illustrated in FIG. 2, the solid-state imaging element chip 2 includes a rectangular chip substrate 2A, the solid-state imaging elements 3 formed on the chip substrate 2A, and a plurality of pads (electrodes) 6 for wiring with the outside arranged outside the solid-state imaging elements 3. The material of the chip substrate 2A is, for example, silicon single crystal, and the thickness is, for example, about 0.15 mm.

A general semiconductor element manufacturing process is applied to manufacture the solid-state imaging element 3. The solid-state imaging element 3 includes a photodiode that is a light receiving element formed on a wafer (the solid-state imaging element chip 2), a transfer electrode for transferring excitation voltage to the outside, a light shielding film having an opening section, and an inter-layer insulating film. An inner lens is formed over the inter-layer insulating film in the solid-state imaging element 3, a color filter is arranged over the inner lens through an intermediate layer, and a microlens and the like are arranged over the color filter through an intermediate layer.

Since the solid-state imaging element 3 is configured this way, the light entered from the outside is collected by the microlens as well as the inner lens and directed to the photodiode, and the effective aperture ratio increases.

Transparent glass with coefficient of thermal expansion close to that of silicon, such as "Pyrex (registered trademark) glass", is used for the cover glass 4, and its thickness is, for example, about 0.1 mm.

An inorganic material with similar physical properties, such as coefficient of thermal expansion, as those of the chip substrate 2A and the cover glass 4 is desirable for the frame-shaped spacer 5. Therefore, for example, polycrystalline silicon is used. When the cross section of part of the frame-shaped spacer 5 that has a shape of a frame is seen, the width of the cross section is, for example, about 0.15 mm, and the thickness is, for example, about 0.05 mm. One end face of the frame-shaped spacer 5 is bonded to the chip substrate 2A using an adhesive 7, and other end is bonded to the cover glass 4 using an adhesive 8.

A first embodiment according to a method for manufacturing solid-state imaging device of the present invention will be described with reference to FIGS. 3A to 3H. In the present embodiment, a cover glass wafer of φ 8 inch outer diameter×t 0.3 mm thickness and a silicon wafer of φ 8 inch outer diameter×t 0.3 mm thickness are used as the original materials.

A case of ultimately manufacturing solid-state imaging devices, which include solid-state imaging element chips with t 0.15 mm thickness, frame-shaped spacers with t 0.05 mm thickness, and cover glasses with t 0.1 mm thickness, all together in a wafer level will be described. Low-alpha ray glass is used for the cover glass wafer in consideration of damage to the solid-state imaging elements.

Figure 3A:
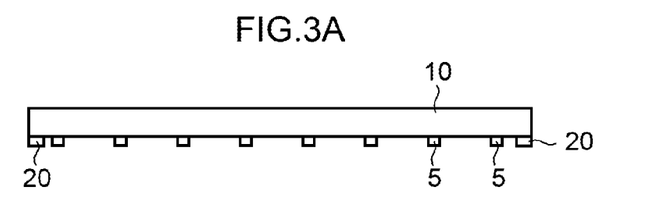
FIG. 3A is an explanatory view illustrating the method for manufacturing solid-state imaging device according to a first embodiment.

As illustrated in FIG. 3A, a multiplicity of (several hundred to several thousand) frame-shaped spacers 5, in which the widths of four sides are 0.1 to 0.15 mm and the heights are t 0.05 mm, are formed in the surface of a cover glass wafer 10 that is a transparent substrate in a size of φ 8 inch×t 0.3 mm. At the same time, a ring-shaped spacer 20 with 150 mm width and t 0.05 mm height are formed at the outer periphery of the cover glass wafer 10. The frame-shaped spacer 5 and the ring-shaped spacer 20 can be manufactured by using, for example, the following methods.

<First Method>

An adhesive is first applied to the cover glass wafer 10, and the outer diameters of the cover glass wafer 10 and a silicon wafer (not illustrated) with the same outer diameter (φ 8 inch×t 0.73 mm), which serves as a member for spacers, are put together and adhered. A surface grinding process by a whetstone is then applied to reduce the thickness of only the silicon wafer to t 0.05 mm. Unnecessary parts of the silicon wafer with reduced thickness are removed by patterning of resist based on a photolithography technique and by a dry etching technique. Lastly, the resist and the adhesive are sequentially removed by dry and wet cleaning, and the frame-shaped spacers 5 and the ring-shaped spacer 20 in necessary sizes are formed.

<Second Method>

A permanent resist for MEMS (Micro Electro Mechanical Systems) with t 0.05 mm thickness is applied to the cover glass wafer 10 by spin coating, and the frame-shaped spacers 5 and the ring-shaped spacers 20 in necessary sizes are formed by the photolithography technique. For example, SU-8 3000 series of Kayaku MicroChem Co., Ltd. and TMMR S2000 of Tokyo Ohka Kogyo Co., Ltd. can be used as the permanent resist for MEMS. Although liquid resists are listed, the resists are not necessarily limited to these, and sheet-type similar products (dry film resist type) may also be used.

<Third Method>

A photosensitive adhesive or an adhesive sheet is applied or laminated by t 0.05 mm thickness over the cover glass wafer 10 by spin coating, and the frame-shaped spacers 5 and the ring-shaped spacers 20 in necessary sizes are formed by the photolithography technique. For example, an adhesive sheet of Nitto Denko Corporation, MA-1000 series of Hitachi Chemical Co., Ltd., and U-100 series of Taiyo Ink Mfg Co., Ltd. can be used as the photosensitive adhesive/adhesive sheet.

The frame-shaped spacers and the ring-shaped spacers are formed by inorganic materials in the first method and by organic materials in the second and third methods. If environmental resistance, such as strict sealing property (moisture resistance), is required for the ultimate solid-state imaging devices, it is preferable to form the frame-shaped spacers and the ring-shaped spacers by the first method.

The methods are not limited to the methods described above as long as similar structures can be highly accurately and efficiently obtained by the methods, such as a screen printing technique or a dispensing method.

In any of the methods, the frame-shaped spacers 5 and the ring-shaped spacers 20 are formed while the thickness of the cover glass wafer 10 is t 0.3 mm. Even if the area of the wafer is large with 8 inch outer diameter, the rigidity is enough if the thickness is t 0.3 mm, and the deflection scarcely occurs. Therefore, the frame-shaped spacers 5 and the ring-shaped spacers 20 can be relatively easily and highly accurately formed.

Furthermore, in addition to the frame-shaped spacers and the ring-shaped spacers, a function film, such as an antireflective coating, can be easily provided over the cover glass wafer 10.

Figure 3B:
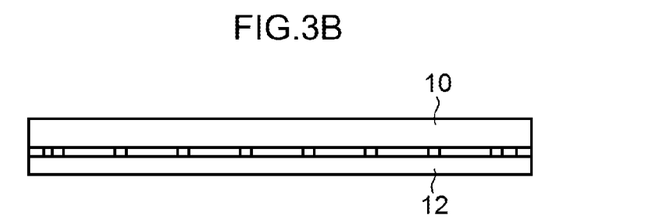
FIG. 3B is an explanatory view illustrating the method for manufacturing solid-state imaging device according to the first embodiment.

Next, as illustrated in FIG. 3B, a mask material 12 is provided on the side of the frame-shaped spacers 5 of the cover glass wafer 10 to cover the frame-shaped spacers 5 and the ring-shaped spacers 20. A one-sided tape type or an application solution type can be used as the mask material 12.

If the thickness of the cover glass wafer 10 is to be reduced in post-processing by a chemical including hydrofluoric acid as a principal component, it is preferable that at least the base material which constitutes the tape with the adhesive layer are resistant to the chemical, such as hydrofluoric acid, if the mask material 12 is the one-sided tape type, and it is preferable that the application solution is resistant to the chemical if the mask material 12 is the application solution type.

Since the mask materials 12 need to be released later, a one-sided tape or an application solution, which has a function of reducing the adhesive strength when external energy is provided (for example, UV light or temperature), is preferable, instead of strong and complete adherence, to prevent damage of the cover glass wafer 10 during the release. Regarding a self-release property of the mask material 12, although the self-release property is not necessarily required, the mask material 12 may have the self-release property.

Considering that the mask material 12 will be eventually released, it is preferable to use a one-sided tape or an application solution having characteristics that the adhesive layer of the tape or foreign materials on the adhesive layer do not adhere (transfer) to the frame-shaped spacers 5.

If the mask material 12 is the one-sided tape type, the one-sided tape can be attached to the frame-shaped spacers 5 and the ring-shaped spacers 20 by a roller or the like.

If the mask material 12 is the application solution type, the application solution can be coated to fill the frame-shaped spacers 5 and the ring-shaped spacers 20 by applying the application solution by spin coating, bar coating, spray coating, and the like, and then curing (drying) the application solution.

As a result, the mask material 12 is supplied to the cover glass wafer 10 to cover the frame-shaped spacers 5 and the ring-shaped spacers 20.

<One-Sided Tape Type>
(1) In the case of the tape type, the tape base material of Elegrip (UB-3083D) of Nitto Denko Corporation is PET with hydrofluoric acid resistance, and can be easily released, because the adhesive strength can be reduced (adhesive layer can be cured) by UV irradiation after the adhesion. Therefore, since there is less attachment to the adhesion surfaces of the spacers, it can be suitably used. Furthermore, since the tape base material is PET, there is IPA resistance, and a drying method of reducing dry stains, such as IPA drying (solvent vapor drying), can be selected after pure water cleaning after wet etching.
(2) Another example of the tape type includes Intelimer tape of Nitta Corporation. The Intelimer tape can be suitably used, because the tape base material is PET with hydrofluoric acid resistance, the adhesive strength can be reduced by heating or cooling after adhesion to easily release the tape, and there is less attachment to the adhesion surfaces. The tape can be released in the atmosphere of, for example, 50° C. or more for the type in which the adhesive strength is reduced by heating, and in the atmosphere of, for example, 40° C. or less for the type in which the adhesive strength is reduced by cooling.

When the one-sided tape type is used, the tape needs to be laminated by a roller or the like while especially paying attention to the adhesion to the ring-shaped spacers 20 of the outer periphery. This is because if the adhesion is insufficient, a chemical, such as an etching solution, may infiltrate in a thickness reduction process of the cover glass wafer 10, and the spacer formation surface of the cover glass wafer 10 may be damaged. After the lamination, unnecessary parts are cut along the outline of the cover glass wafer 10. In addition, the followings can be applied as the mask material.

<Liquid Type>
(1) For example, UV-curable temporary fixation adhesives, TEMPLOC series, of Denki Kagaku Kogyo Co., Ltd. can be used as the mask material 12. After the application and UV curing, the adhesives swell by immersion in hot water of about 60 to 80° C. for several minutes, and the adhesive strength is reduced, and therefore, the adhesives can be easily released. The adhesives are suitable because the adhesives are resistant to hydrofluoric acid, and there is less attachment to the adhesion surfaces of the frame-shaped spacers 5 after the release.
(2) For example, UV-curable adhesives, LC-3000 series, of Sumitomo 3M Co., Ltd. can be used as the mask material 12. The adhesives can be suitably used because, although there is no reduction function of adhesive strength when external energy is provided after the application and curing (adhesion), the adhesives naturally have good release properties, the adhesives are resistant to hydrofluoric acid, and there is less attachment to the adhesion surfaces of the frame-shaped spacers 5.

The members are not limited to the present embodiment as long as the members have similar functions. Although the principal components of the members described above are resins, non-resin materials (for example, inorganic materials, such as a silicon wafer and a glass wafer, that are sufficiently thicker than the glass wafer 10) may be further attached to the members in consideration of extremely little water absorption and vapor transmission of the etching solution described below.

Figure 3C:
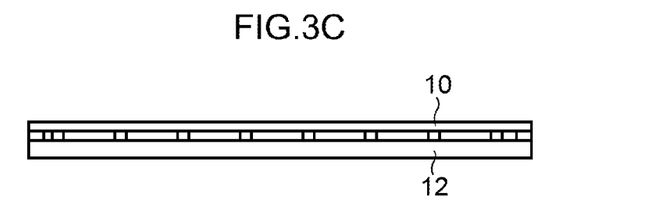
FIG. 3C is an explanatory view illustrating the method for manufacturing solid-state imaging device according to the first embodiment.

Next, as illustrated in FIG. 3C, the cover glass wafer 10 provided with the mask material 12 is immersed in a chemical such as hydrofluoric acid, and the thickness of the opposite side of the spacer formation surface is reduced by chemical processing until the thickness is between t 0.3 mm to t 0.1 mm. At this point, the etching rate needs to be paid attention to avoid the surface of the cover glass wafer 10 from becoming rough by chemical reaction.

In the thickness reduction process, since the glass surface on the side of the spacers of the cover glass wafer 10 (eventually, the surface inside the cover glass of the solid-state imaging device) is sealed by the mask material 12 and the ring-shaped spacers 20, there is no infiltration of chemical. As a result, the glass surface on the side of the spacers of the cover glass wafer 10 is protected from damage by chemical.

The reduction in thickness by wet etching is non-load processing. Since the mask material 12 attached to the spacer side also functions as a support, the cover glass wafer 10 can be processed without damage in the etching process, or during subsequent pure water cleaning or drying.

A method by wet etching with low load and with low risk of damage in processing for the processing target has been described as a suitable method of making the cover glass wafer 10 thinner. However, a method by a mechanical polishing process, such as lapping and polishing, can also be adopted. In this case too, the mask material 12 plays a role of protecting the spacer side of the cover glass wafer 10 from the polishing dust and abrasive.

Figure 3D:
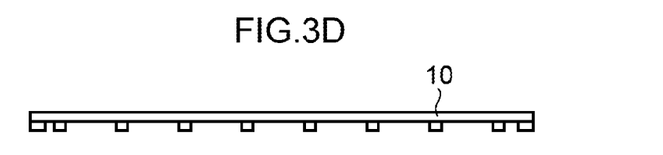
FIG. 3D is an explanatory view illustrating the method for manufacturing solid-state imaging device according to the first embodiment.

Next, as illustrated in FIG. 3D, the mask material 12 is released from the cover glass wafer 10. Since the cover glass wafer 10 is extremely thin upon the release of the mask material 12, it is preferable to release the mask material 12 when the glass surface side is adsorbed and fixed on a flat vacuum adsorption table (not illustrated) to prevent damage by tensility during the release.

When a member, in which the adhesive strength is reduced by external energy (for example, UV light or temperature), is used as the mask material 12, it is preferable to release it after the application of the external energy or while the external energy is applied.

For example, when a member, in which the adhesive strength is reduced by UV light, is used as the mask material 12, UV light is directed for about 30 sec at the illuminance of 30 mW from the side of the mask material 12, the etched glass surface side is fixed by vacuum to the vacuum adsorption table, and the mask material 12 is slowly released. The adhesive strength is reduced by the UV light irradiation, and the cover glass wafer 10 is firmly fixed to the vacuum adsorption table, and therefore, the mask material 12 can be easily peeled off without damage.

A porous structure is suitable for the vacuum adsorption table, because the adsorptive power is provided to the entire surface of the table. It is preferable that the flatness is 5 μm or less to prevent damage from the adsorptive power.

Predetermined release conditions are provided in accordance with the material used for the mask material 12 to release the mask material 12.

Figure 3E:
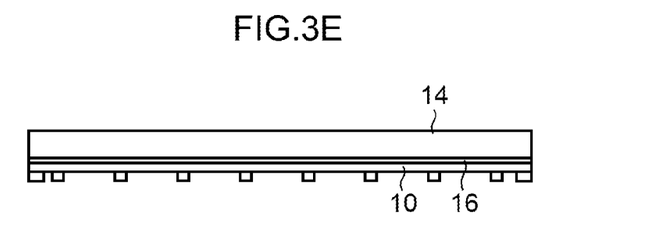
FIG. 3E is an explanatory view illustrating the method for manufacturing solid-state imaging device according to the first embodiment.

Next, as illustrated in FIG. 3E, a first support wafer 14 is attached to the glass surface on the opposite side of the spacer side of the cover glass wafer 10, on which the frame-shaped spacers 5 are formed, through a lamination member 16. An object of the first support wafer 14 is to simply secure the rigidity during handling.

It is preferable that the lamination member 16 is a two-sided tape, an adhesive, or the like that is characterized by self-release property and less attachment to the glass surface. Semiconductor processing, such as formation of the frame-shaped spacers 5, is not executed when the first support wafer 14 is attached to the cover glass wafer 10. Therefore, resistance to severe process environments, such as chemical resistance, water resistance, vacuum resistance, plasma resistance, and high-temperature resistance, is not required for the lamination member 16. Therefore, there are more options for the members applicable to the lamination member 16.

The first support wafer 14 is attached to the cover glass wafer 10 as follows.

The spacer side of the cover glass wafer 10 is fixed to the vacuum adsorption table. It is preferable to use a vacuum adsorption table in a porous structure with 5 μm or less flatness as described above.

While the cover glass wafer 10 is adsorbed and fixed to the vacuum adsorption table, a Pyrex (registered trademark) glass with the same outer diameter (φ 8 inch) and with t 0.5 mm thickness is laminated as the first support wafer 14 on the side of the cover glass wafer 10.

A two-sided tape, Selfa BG, of Sekisui Chemical Co., Ltd. can be used as the lamination member 16. Selfa BG has a function of generating a self-release effect when UV is directed to one side. In this case, the adhesion is released by outgassing generated by UV irradiation. It is useful to release the first support wafer 14 from the cover glass wafer 10 later, it is designed to leave less adhesive layer, and it can be suitably used.

Alternatively, the following systems and members can be possibly applied.
<Two-Sided Tape Type>

For example, thermal release two-sided tapes, such as Revalpha of Nitto Denko Corporation and Elegrip of Denki Kagaku Co., Ltd., can be suitably used. The thermal release two-sided tapes have self-release functions of releasing the adhesion by reducing the adhesive area by expansion of microcapsules included in the adhesive layers by heating, and there is less attachment to the adhesion surface.
<Adhesive Type>

For example, temporary adhesives and the like, such as a temporary adhesive Ecosepara of Kaken Tech Co., Ltd. and TEMPLOC of Denki Kagaku Kogyo Co., Ltd., can be suitably used. The adhesives have self-release properties by immersion to hot water and have functions of reducing the adhesive strength. In this case, the adhesives are not dissolved (resolved) into hot water, and the adhesives can be released as integrally formed objects that maintain the applied forms, and the working efficiency is good, and the adhesives are useful. However, paths of hot water need to be provided such as by providing a multiplicity of minute holes to the first support wafer 14 to efficiently swell the adhesion section (=entire surface of wafer) by hot water.
<Others>

For example, WSS (Wafer-Support-System) of Sumitomo 3M Co., Ltd. and a Zero-Newton system of Tokyo Ohka Kogyo Co., Ltd. can be suitably used. Although special lamination/release apparatus or releasing solution are necessary, they are useful as methods of temporarily providing a support wafer. The systems and the members are not limited to the present embodiment, as long as the systems and the members have similar functions.

The silicon wafer is prepared in a process different from FIGS. 3A to 3E, in which the thickness of the cover glass wafer 10 is reduced to attach the cover glass wafer 10 and the first support wafer 14.

Figure 3F:
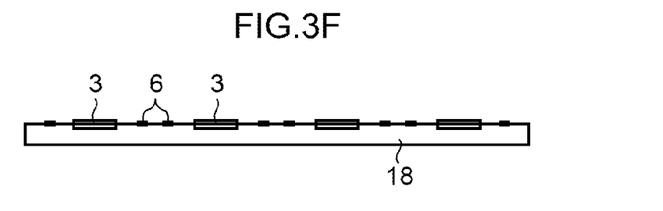
FIG. 3F is an explanatory view illustrating the method for manufacturing solid-state imaging device according to the first embodiment.

As illustrated in FIG. 3F, a general semiconductor element manufacturing process is applied to the surface of a silicon wafer 18 (φ 8 inch×t 0.3 mm) that is a semiconductor substrate, and the plurality of solid-state imaging elements 3 and the pads 6 are formed.

Figure 3G:
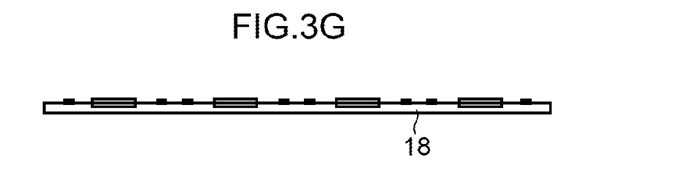
FIG. 3G is an explanatory view illustrating the method for manufacturing solid-state imaging device according to the first embodiment.

Next, as illustrated in FIG. 3G, the back side of the silicon wafer 18 is polished by back grinding or the like to reduce the thickness to t 0.15 mm. A mask material may be provided on the surface of the silicon wafer 18 to reduce the thickness of the back side by the wet etching process.

Figure 3H:
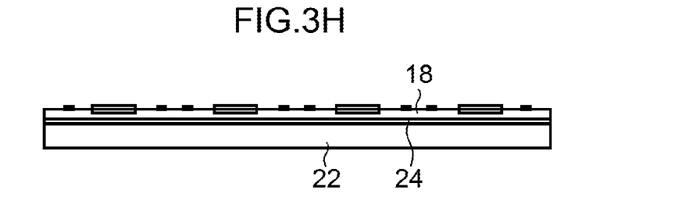
FIG. 3H is an explanatory view illustrating the method for manufacturing solid-state imaging device according to the first embodiment.

Next, as illustrated in FIG. 3H, a second support wafer 22 is laminated on the back side of the silicon wafer 18 through a lamination member 24. In consideration of the release of the second support wafer 22 in post-processing, it is preferable that the lamination member 24 has the self-release property.

However, since the second support wafer 22 is attached to the back side of the silicon wafer 18, unlike the lamination member 16, there is not much problem if some of the adhesive layer remains as long as there is no influence on the electrical characteristics, the assembly into a module, and the like.

The second support wafer 22 is attached to the silicon wafer 18 as follows. A Pyrex (registered trademark) glass t 0.5 mm with the same outer diameter (φ 8 inch) is laminated as a second support wafer on the polished surface of the silicon wafer 18 by a self-release two-sided tape (Selfa BG).

The lamination member/system as described in FIG. 3E can also be used in the process.

Figure 3I:
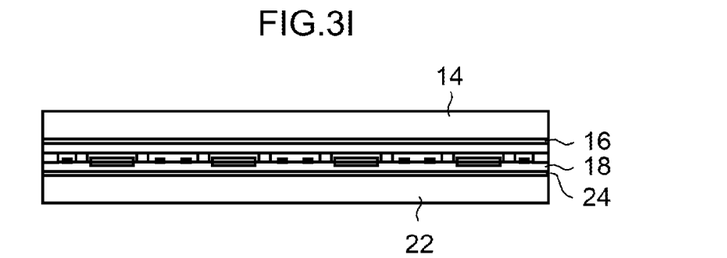
FIG. 3I is an explanatory view illustrating the method for manufacturing solid-state imaging device according to the first embodiment.

Next, as illustrated in FIG. 3I, while a time curing type adhesive is transferred to the adhesion surfaces of the frame-shaped spacers 5, the cover glass wafer 10 and the silicon wafer 18 are three-dimensionally positioned and bonded so that the frame-shaped spacers 5 surround the light receiving areas of the solid-state imaging elements 3. After the bonding, they are pressurized from the sides of the first and second support wafers 14 and 22 and are left being adhered until the adhesive is completely cured.

Since the first and second support wafers 14 and 22 are attached to the cover glass wafer 10 and the silicon wafer 18, damage by handling can be prevented. Since the flatness is also maintained, highly accurate alignment and bonding can be easily performed.

Figure 3J:
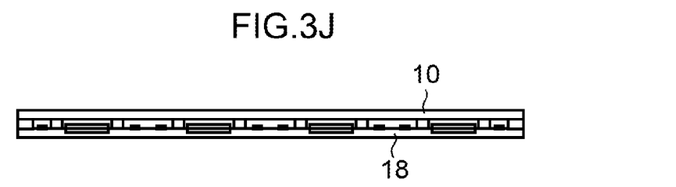
FIG. 3J is an explanatory view illustrating the method for manufacturing solid-state imaging device according to the first embodiment.

Next, as illustrated in FIG. 3J, the cover glass wafer 10 and the first support wafer 14 as well as the silicon wafer 18 and the second support wafer 22 are released by the self-release effect of the lamination members 16 and 24. The first and second support wafers 14 and 22 can be repeatedly used.

If the lamination members 16 and 24 are two-sided tapes (Selfa BG), the cover glass wafer 10 and the first support wafer 14 as well as the silicon wafer 18 and the second support wafer 22 are specifically released by the following procedure.

UV light is directed for about 100 sec at 30 mW illuminance from the side of the first support wafer 14. Since the first support wafer 14 is a transparent substrate, the UV light is penetrated through and is directed to a two-sided tape (Selfa BG) that is the lamination member 16. The self-release effect (release of adhesion by outgassing) is generated in the lamination member 16 by the UV irradiation. Even if rigid wafers are laminated, the first support wafer 14 can be easily released from the cover glass wafer 10.

By a similar procedure, UV light is directed for about 100 sec at 30 mW illuminance from the side of the second support wafer 22. As a result, the second support wafer 22 can be easily released from the silicon wafer 18.

Either one of the release of the cover glass wafer 10 and the first support wafer 14 and the release of the silicon wafer 18 and the second support wafer 22 may be performed first.

When the first support wafer 14 and the second support wafer 22 are released, the total thickness is t 0.30 mm (=thickness t 0.1 mm of cover glass wafer+height t 0.05 mm of spacers+t 0.15 mm of silicon wafer), which is a thickness that can sufficiently secure the rigidity, and there is no problem in handling. If various systems and members as described in FIG. 3E are used for the lamination members 16 and 24, predetermined release conditions (such as heat conditions and swell conditions) are provided respectively to release the first and second support wafers 14 and 22.

Figure 3K:
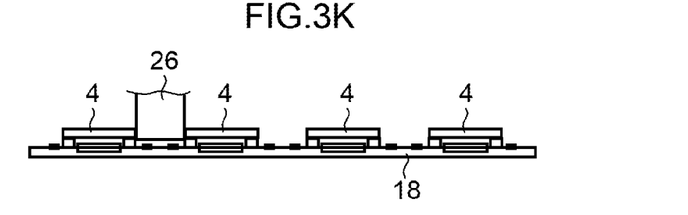
FIG. 3K is an explanatory view illustrating the method for manufacturing solid-state imaging device according to the first embodiment.

As illustrated in FIG. 3K, a dicing apparatus or the like is used to apply a cut-off grinding process to only the cover glass wafer 10 by a disc-shaped whetstone (dicing blade) 26 to dice the cover glass wafer 10 into cover glasses 4. The whetstone 26 that has a width (0.1 to 1.0 mm) necessary to expose the surfaces of the pads 6 on the silicon wafer 18 and that has a cross section shaped in a rectangle is used, and the height of the whetstone 26 is set so that the lowest point of the whetstone 26 passes through the height of 0.02 to 0.03 mm from the surface of the silicon wafer 18 to apply the cut-off grinding process to an X-axis direction and a Y-axis direction perpendicular to each other on the plane of the cover glass wafer 10.

A whetstone with fine texture of about abrasive grain #600 to 1200 is selected as the whetstone 26 to reduce the size of the grinding dust (glass fragments) or to reduce the grinding dust as much as possible during processing. Furthermore, it is preferable to select an elastic resin bond that has small holding power of abrasive grains and that has a self-sharpening effect as a bonding material to reduce the grinding resistance. The processing speed is set to a relatively slow range of 0.5 to 2 mm/sec.

Figure 3L:
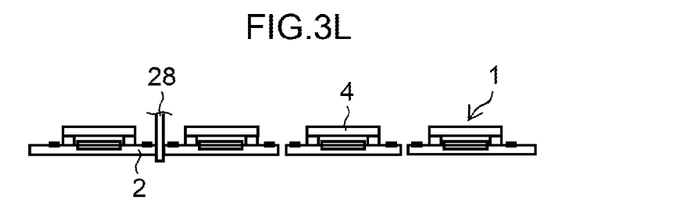
FIG. 3L is an explanatory view illustrating the method for manufacturing solid-state imaging device according to the first embodiment.

Next, as illustrated in FIG. 3L, the cut-off grinding process is applied by a thin whetstone (about t 0.04 mm) to the silicon wafer 18 in the X-axis direction and the Y-axis direction along the dicing streets to dice the silicon wafer 18 into the solid-state imaging element chips 2. As a result, a multiplicity of thin solid-state imaging devices 1 with t 0.30 mm total thickness can be collectively and simultaneously manufactured in the wafer level.

Next, a second embodiment of the method for manufacturing solid-state imaging device according to the present invention will be described with reference to FIGS. 4A to 4I. The same configurations as described in the first embodiment may be designated with the same reference numerals, and the description may not be repeated. The manufacturing process of the silicon wafer 18 equivalent to FIGS. 3F to 3H is not illustrated. In the method of the second embodiment, a method of individualizing the cover glass wafer to form cover glasses is different from the method of the first embodiment.

Figure 4A:
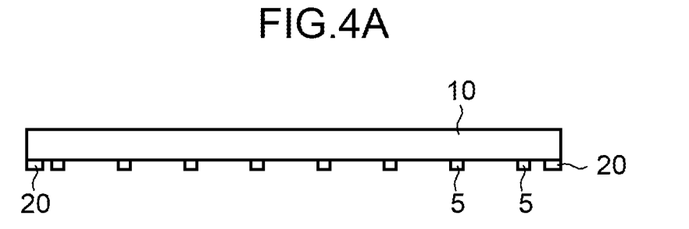
FIG. 4A is an explanatory view illustrating the method for manufacturing solid-state imaging device according to a second embodiment.
Figure 4B:
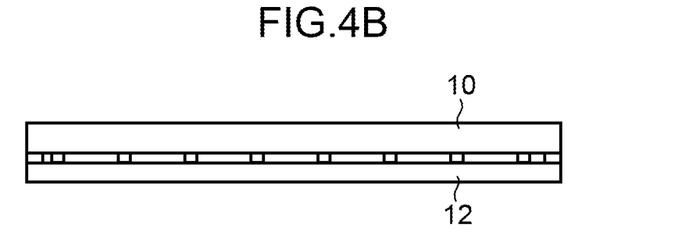
FIG. 4B is an explanatory view illustrating the method for manufacturing solid-state imaging device according to the second embodiment.
Figure 4C:
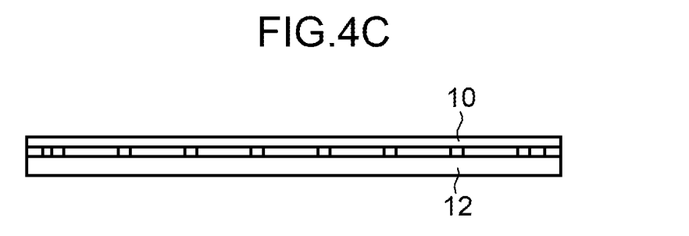
FIG. 4C is an explanatory view illustrating the method for manufacturing solid-state imaging device according to the second embodiment.
Figure 4D:
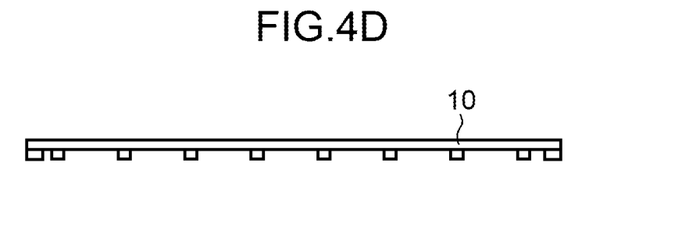
FIG. 4D is an explanatory view illustrating the method for manufacturing solid-state imaging device according to the second embodiment.
Figure 4E:
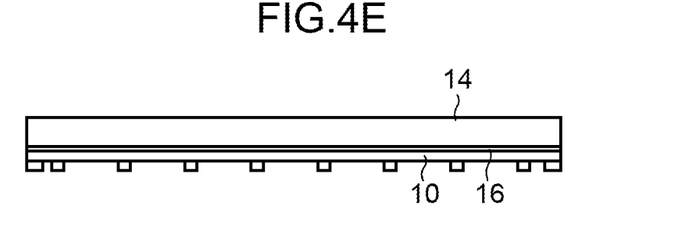
FIG. 4E is an explanatory view illustrating the method for manufacturing solid-state imaging device according to the second embodiment.
Figure 4F:
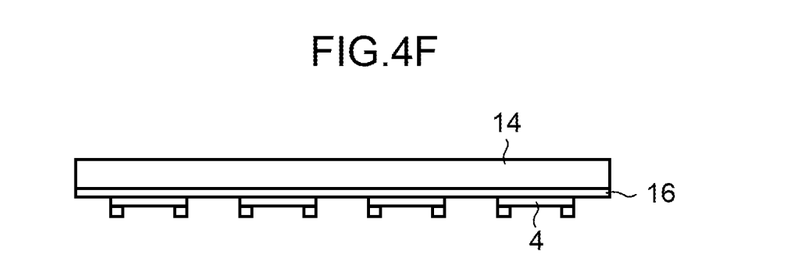
FIG. 4F is an explanatory view illustrating the method for manufacturing solid-state imaging device according to the second embodiment.

Processes of FIGS. 4A to 4E are exactly the same as the processes of FIGS. 3A to 3E. As illustrated in FIG. 4F, the cover glass wafer 10 can be diced into the cover glasses 4 while the first support wafer 14 is laminated on the cover glass wafer 10 through the lamination member 16.

As illustrated in FIG. 3K, the cover glass wafer 10 can be diced into the cover glasses 4 by the whetstone 26 while the cover glass wafer 10 and the silicon wafer 18 are laminated. However, the distance between the lowest point of the whetstone 26 and the silicon wafer 18 is short when the height of the frame-shaped spacer 5 is low. As a result, the clearance for discharging the grinding dust of the cover glass wafer 10 is small. The possibility of the grinding dust damaging the silicon wafer 18 is higher.

Meanwhile, according to the method of the second embodiment, the cover glass wafer 10 is diced into the cover glasses 4 before the cover glass wafer 10 and the silicon wafer 18 are laminated and while the first support wafer 14 is laminated on the cover glass wafer 10 through the lamination member 16. Therefore, the grinding dust of the cover glass wafer 10 does not damage the silicon wafer 18.

Figure 5:
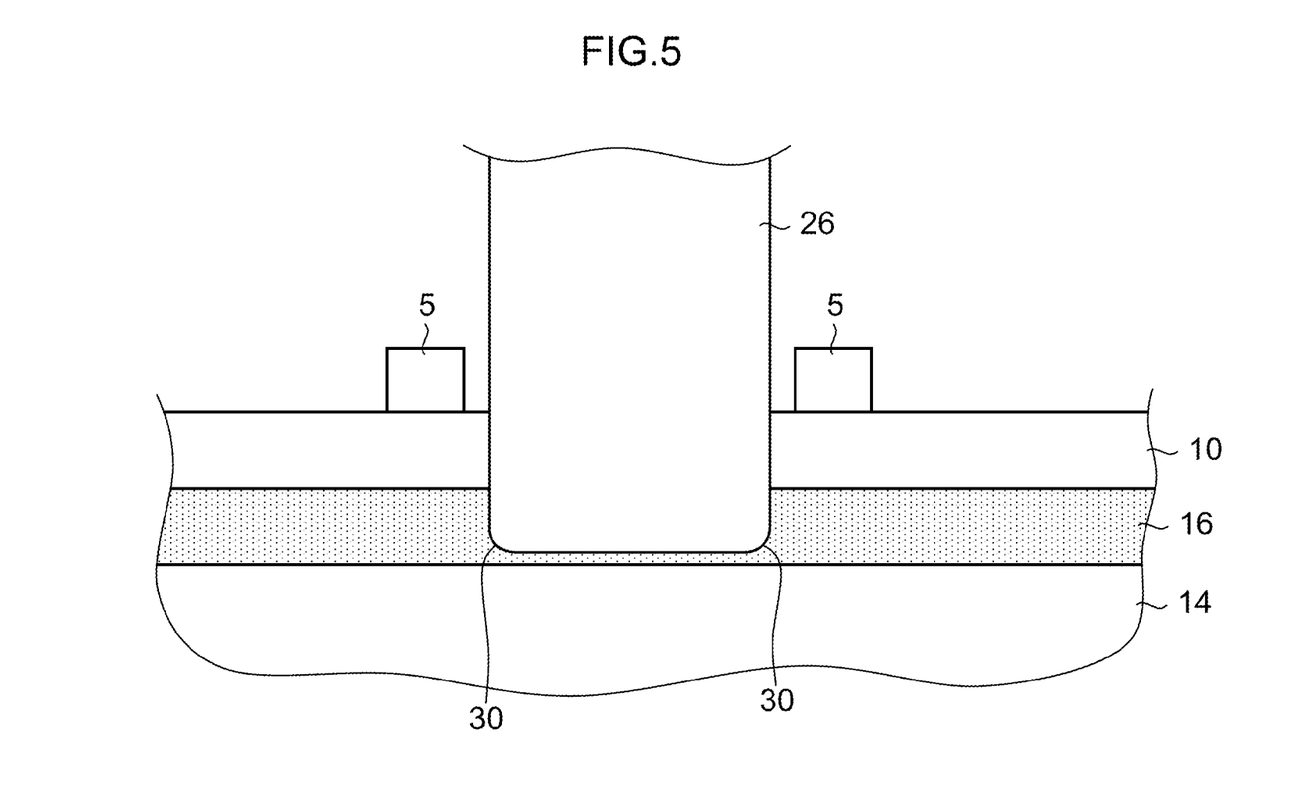
FIG. 5 is a diagram illustrating a state of grinding and cutting a cover glass wafer by a whetstone.

FIG. 5 illustrates a state of grinding and cutting the cover glass wafer 10 by the whetstone 26. The whetstone 26 that has a width (0.1 to 1.0 mm) and that has a cross section shaped into a rectangle is used, and the height of the whetstone 26 is set to a height for slightly cutting the lamination member 16 of the first support wafer 14 from the side of the frame-shaped spacer 5 to dice (fully cut) the cover glass wafer 10 into the cover glasses 4.

The edges of the whetstone 26 are not complete right angles, but precisely, the edges have roundness 30 (about R=0.04 mm). It is important not to leave protrusions on the cut surfaces of the cover glasses 4 caused by the roundness 30. The thickness of the lamination member 16 is set to t 0.08 mm or greater, and the amount of cutting the lamination member 16 by the whetstone 26 is set to a range of 0.04 to 0.07 mm. Since the roundness 30 at the tips of the whetstone 26 are cut into the middle of the lamination member 16, the influence by the roundness of the edges of the whetstone 26 can be prevented.

Since the grinding dust during processing does not damage the silicon wafer, the processing speed can be set to 2 to 5 mm/sec. As a result, the cut-off grinding process can be executed faster than the dicing of the cover glasses 4 from the cover glass wafer 10 in FIG. 3K.

The whetstone 26 is set so as not to cut the first support wafer 14. Therefore, the lamination member 16 is not diced. After the first support wafer 14 is released from the plurality of cover glasses 4, the lamination member 16 can be released altogether from the first support wafer 14. This allows easily performing the reproduction operation of the first support wafer 14.

Figure 4G:
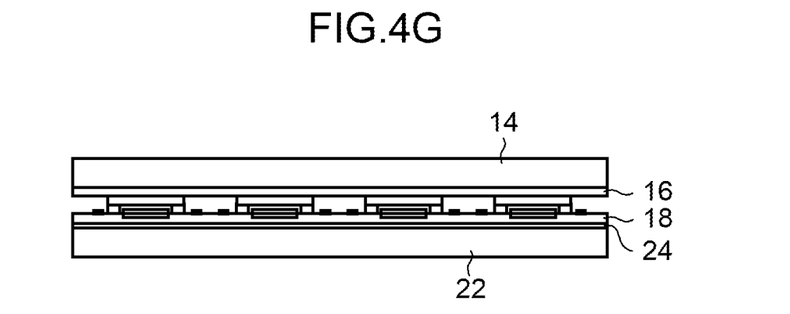
FIG. 4G is an explanatory view illustrating the method for manufacturing solid-state imaging device according to the second embodiment.

Next, as illustrated in FIG. 4G, while a timing curing type adhesive is transferred to the adhesion surfaces of the frame-shaped spacers 5, the cover glass wafer 10 and the silicon wafer 18 are three-dimensionally positioned and bonded so that the frame-shaped spacers 5 surround the light receiving areas of the solid-state imaging elements 3. After the bonding, they are pressurized from the sides of the first and second support wafers 14 and 22 and are left being adhered until the adhesive is completely cured.

Figure 4H:
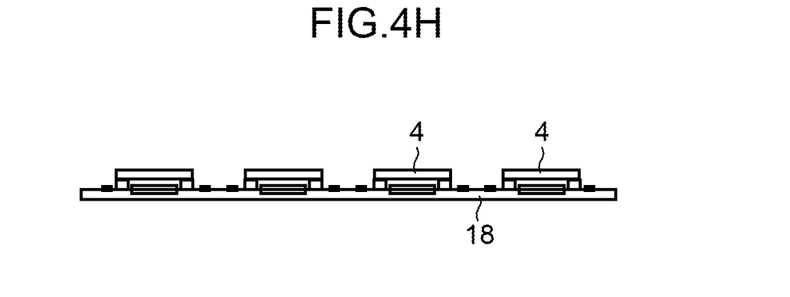
FIG. 4H is an explanatory view illustrating the method for manufacturing solid-state imaging device according to the second embodiment.

Next, as illustrated in FIG. 4H, the cover glass wafer 10 and the first support wafer 14 as well as the silicon wafer 18 and the second support wafer 22 are released by the self-release effect of the lamination members 16 and 24. The first and second support wafers 14 and 22 can be repeatedly used.

Figure 4I:
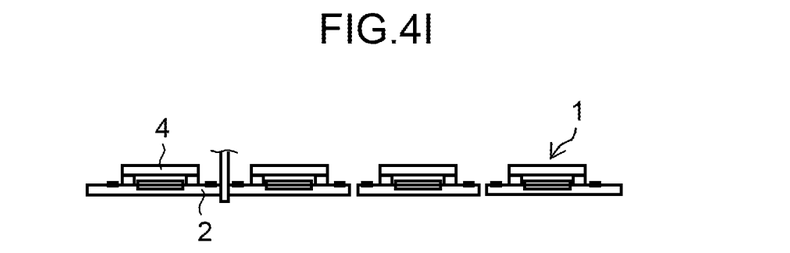
FIG. 4I is an explanatory view illustrating the method for manufacturing solid-state imaging device according to the second embodiment.

Next, as illustrated in FIG. 4I, the cut-off grinding process is applied by a thin whetstone (about t 0.04 mm) to the silicon wafer 18 in the X-axis direction and the Y-axis direction along the dicing streets to dice the silicon wafer 18. As a result, a multiplicity of thin solid-state imaging devices with t 0.30 mm total thickness can be collectively and simultaneously manufactured in the wafer level.

Reference Signs List

1 . . . solid-state imaging device, 2 . . . solid-state imaging element chip, 3 . . . solid-state imaging element, 4 . . . cover glass, 5 . . . frame-shaped spacer, 6 . . . pad, 10 . . . cover glass wafer, 12 . . . mask material, 16, 24 . . . lamination members, 14 . . . first support wafer, 18 . . . silicon wafer, 20 . . . ring-shaped spacer, 22 . . . second support wafer, 26, 28 . . . whetstones

The invention claimed is:

1. A method for manufacturing solid-state imaging device, the method comprising:
a step of forming a plurality of frame-shaped spacers and a ring-shaped spacer surrounding the frame-shaped spacers along an outer periphery of a transparent substrate, on one surface of the transparent substrate that serves as a base material of a cover glass;
a step of providing a mask material on a side of the one surface of the transparent substrate to cover the frame-shaped spacers and the ring-shaped spacer;
a step of removing the transparent substrate from a side of the other surface to set thickness within a predetermined range;
a step of removing the mask material from the transparent substrate;
a step of laminating a first support wafer on the other surface of the transparent substrate, the other surface of the transparent substrate being an opposite surface to the one surface on which the spacers are formed;
a step of forming a plurality of solid-state imaging elements on one surface of a semiconductor substrate;
a step of removing the semiconductor substrate from a side of the other surface to set thickness within a predetermined range;
a step of laminating a second support wafer on the other surface of the semiconductor substrate, the other surface being of the semiconductor substrate being an opposite surface to the one surface on which the plurality of solid-state imaging elements are formed;
a step of bonding the semiconductor substrate and the transparent substrate through the spacers;
a step of releasing the first support wafer and the second support wafer from the transparent substrate and the semiconductor substrate;
a step of dicing the transparent substrate; and
a step of dicing the semiconductor substrate.

2. A method for manufacturing solid-state imaging device, the method comprising:
a step of forming a plurality of frame-shaped spacers and a ring-shaped spacer surrounding the frame-shaped spacers along an outer periphery of a transparent substrate, on one surface of the transparent substrate that serves as a base material of a cover glass;
a step of providing a mask material on a side of the one surface of the transparent substrate to cover the frame-shaped spacers and the ring-shaped spacer;
a step of removing the transparent substrate from a side of the other surface to set thickness within a predetermined range;
a step of removing the mask material from the transparent substrate;
a step of laminating a first support wafer on the other surface of the transparent substrate, the other surface of the transparent substrate being an opposite surface to the one surface on which the spacers are formed;
a step of dicing the transparent substrate into cover glasses;
a step of forming a plurality of solid-state imaging elements on one surface of a semiconductor substrate;
a step of removing the semiconductor substrate from a side of the other surface to set thickness within a predetermined range;
a step of laminating a second support wafer on the other surface of the semiconductor substrate, the other surface of the semiconductor substrate being an opposite surface to the one surface on which the plurality of solid-state imaging elements are formed;
a step of bonding the semiconductor substrate and the cover glasses through the spacers;
a step of releasing the first support wafer and the second support wafer from the transparent substrate and the semiconductor substrate; and
a step of dicing the semiconductor substrate.

3. The method for manufacturing solid-state imaging device according to claim 1, wherein
the step of removing the transparent substrate from the side of the other surface to set the thickness within a predetermined range is a step of etching the transparent substrate from the side of the other surface by a chemical including hydrofluoric acid as a principal component.

4. The method for manufacturing solid-state imaging device according to claim 3, wherein
the mask material is constituted by a material resistant to hydrofluoric acid.

5. The method for manufacturing solid-state imaging device according to claim 1, wherein
the step of removing the transparent substrate from the side of the other side to set the thickness within a predetermined range is a step of polishing the transparent substrate from the side of the other surface by lapping and/or polishing.

6. The method for manufacturing solid-state imaging device according to claim 1, wherein
the mask material is a one-sided tape or an application solution in which the adhesive strength is reduced when external energy is provided.

7. The method for manufacturing solid-state imaging device according to claim 1, wherein
a member for laminating the transparent substrate and the first support wafer is a two-sided tape or an adhesive with a self-release property.

8. The method for manufacturing solid-state imaging device according to claim 1, wherein
a member for laminating the semiconductor substrate and the second support wafer is a two-sided tape or an adhesive with a self-release property.

9. The method for manufacturing solid-state imaging device according to claim 2, wherein
the step of removing the transparent substrate from the side of the other surface to set the thickness within a predetermined range is a step of etching the transparent substrate from the side of the other surface by a chemical including hydrofluoric acid as a principal component.

10. The method for manufacturing solid-state imaging device according to claim 9, wherein
the mask material is constituted by a material resistant to hydrofluoric acid.

11. The method for manufacturing solid-state imaging device according to claim 2, wherein
the step of removing the transparent substrate from the side of the other side to set the thickness within a predetermined range is a step of polishing the transparent substrate from the side of the other surface by lapping and/or polishing.

* * * * *